United States Patent [19]
Sato

[11] Patent Number: 5,238,849
[45] Date of Patent: Aug. 24, 1993

[54] METHOD OF FABRICATING SEMICONDUCTOR DEVICE

[75] Inventor: Fumihiko Sato, Tokyo, Japan

[73] Assignee: NEC Corporation, Japan

[21] Appl. No.: 753,065

[22] Filed: Aug. 30, 1991

[30] Foreign Application Priority Data

Aug. 30, 1990 [JP] Japan .................. 2-228729

[51] Int. Cl.[5] .......................................... H01L 21/329
[52] U.S. Cl. ...................... 437/32; 437/186; 437/946; 437/233; 148/DIG. 17; 148/DIG. 118; 148/DIG. 124
[58] Field of Search ............ 148/DIG. 117, DIG. 124, 148/DIG. 118, DIG. 17; 437/946, 233, 101, 32, 103, 31, 186

[56] References Cited

U.S. PATENT DOCUMENTS

| | | |
|---|---|---|
| 4,118,250 | 10/1978 | Horng et al. |
| 4,543,592 | 9/1985 | Itsumi et al. ............... 357/41 |
| 4,585,668 | 4/1986 | Asnussen et al. ........... 437/238 |
| 4,804,640 | 2/1989 | Kaganowicz et al. ....... 437/236 |
| 5,039,625 | 8/1991 | Reesuan et al. ............. 437/238 |
| 5,089,441 | 2/1992 | Moslehi ...................... 437/225 |

OTHER PUBLICATIONS

Machida, K., "SiO$_2$ Planarization . . . Interconnections", J. Vac. Sci & Technol. B vol. 4 Jul./Aug. 1986 pp. 818–820.

Ghandhi, S., *VSLI Fabrication Principles: Silicon and Gallium Arsenide*, 1983 pp. 517–518.

*Primary Examiner*—George Fourson
*Attorney, Agent, or Firm*—Laff, Whitesel, Conte & Saret

[57] ABSTRACT

A bipolar transistor having a silicon oxide film having a stoichiometric composition ratio of silicon to oxygen controlled to 1 to 2 formed at the boundary between a monocrystalline layer and a polycrystalline layer. In fabrication, a natural oxidized film formed on the surface of an intrinsic base region of a single-crystal is removed in an ultrahigh-vacuum chamber. Subsequently, oxygen ions are supplied to the surface of the base region at room temperature to form a silicon oxide film. Further, silicon molecular beams are supplied in the same chamber to form the polycrystalline silicon layer. The current gain factor $h_{FE}$ of the bipolar transistor thus formed can be greatly improved.

7 Claims, 8 Drawing Sheets

METHOD OF FABRICATING SEMICONDUCTOR DEVICE

BACKGROUND OF THE INVENTION

(1) Field of the Invention

The present invention relates to a method of fabricating a semiconductor device and, more particularly, to a method of fabricating a silicon (Si) bipolar transistor.

(2) Description of the Related Art

A previously known technique of enhancing the current gain factor $h_{FE}$ of a bipolar transistor is to form a thin silicon oxide film on a surface of the base region and thereafter to form an emitter region by way of impurity diffusion through the oxide film. More specifically, an opening is made in the insulating layer covering the base region so as to expose a part of the base region, and then the silicon oxide film is formed on the exposed surface. A polycrystalline silicon (also called "polysilicon") layer containing impurities is formed on the silicon oxide film, and the impurities contained in the polysilicon are diffused into the base region through the silicon oxide film to form the emitter region.

In such a transistor, the thickness of the silicon oxide film to be formed on a single-crystal layer and its characteristics play an important role to improve such factor as $h_{FE}$ of the transistor.

Japanese Patent Application Kokai No. Hei 2 (1990)-210,820 proposes two methods of forming such a silicon oxide film.

One method is as explained hereinafter. First, an n-or p-type silicon substrate (100) having a diameter of 4 inches and a resistivity of 0.01~0.02Ω·cm is RCA-cleansed and thereafter is introduced in an MBE (Molecular Beam Epitaxy) growth equipment which is provided with a 40 cc electron gun type silicon evaporator. An amorphous silicon is deposited 10 Å in thickness on the silicon substrate, and thereafter the natural oxide film on the surface is removed by the cleaning treatment under the condition of 800° C. and one minute. An epitaxial layer to be used as a buffer layer is grown 3000 Å in thickness under the condition of 500° C. While the substrate temperature is lowered to room temperature and oxygen gas having a purity of 99.9999% is allowed to leak from a nozzle into the MBE growth equipment at the partial pressure of oxygen of $5\times10^{-5}$ Torr, a silicon molecular beam is projected from the electron gun type silicon evaporator to the buffer layer to form a silicon oxide film. The oxygen leaked in the growing chamber is exhausted. The silicon molecular beam is further projected in an atmosphere of the vacuum degree of $1\times10^{-9}$ Torr and the substrate temperature of 500° C. to deposit a polysilicon.

The other method disclosed is a low pressure oxidation technique in which only oxygen molecules are projected to a heated silicon substrate. In this method, a cleaned silicon (100) plane is oxidized for about 30 minutes under the condition of the substrate temperature of 500° C. and the oxygen partial pressure of $5\times10^{-5}$ Torr. Thereafter, the silicon molecular beam is projected as in the first method to deposit the polysilicon.

The above conventional methods of forming the interfacial silicon oxide film suffer from the following problems.

Figure 12:
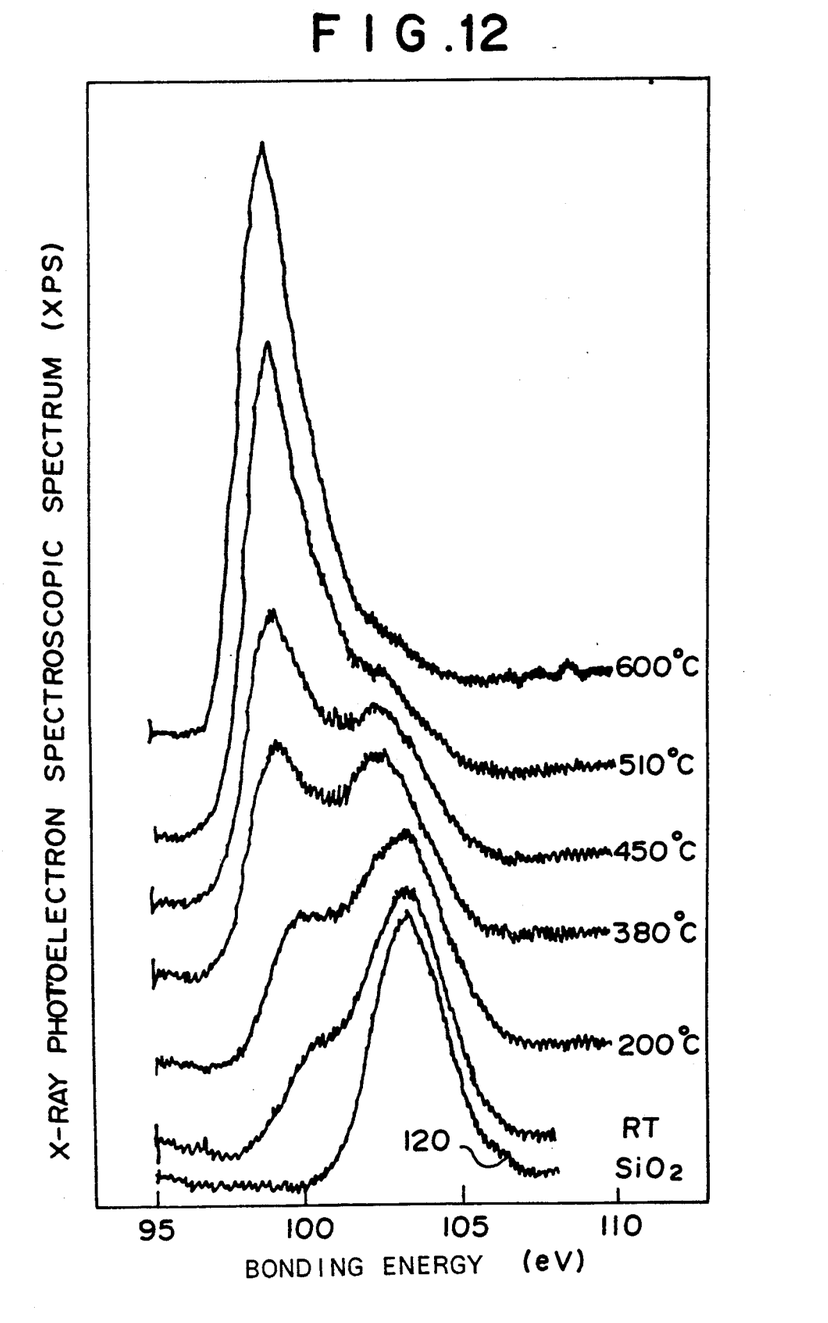
FIG. 12 is a graph showing oxidizing temperature dependency of the photoelectron spectroscopic spectrum (XPS) of the silicon oxide film formed in accordance with the prior art technique.

The interfacial silicon oxide film formed by the first method of the prior art contains more silicon than the silicon oxide film having an accurate stoichiometric composition ratio, i.e., SiO$_2$, as disclosed in FIG. 1(a) of Japanese Journal of Applied Physics Vol. 28, No. 10, October 1989, pp. L1678-L1681, "Si/SiOx/Si Hole-Barrier Fabrication for Bipolar Transistors Using Molecular Beam Deposition". This state is shown in FIG. 12. In FIG. 12, a curve 120 is directed to the case where the composition ratio of silicon (Si) to oxygen (O) is 1:2. The remaining curves are directed to the cases with the deposition temperature varied according to the conventional method. As seen, lower the deposition temperature is, more the composition ratio of the film approaches the SiO$_2$. However, even if the silicon oxide film is formed at room temperature (RT), its composition is silicon-rich since the bonding energy has a peak in the neighborhood of 100 eV. As described later, the silicon bipolar transistor having the silicon-rich silicon oxide film at the boundary between the polysilicon and the single-crystal silicon has a problem that its current gain factor $h_{FE}$ cannot be improved.

On the other hand, although the deposition temperature in the second method of the prior art is not so high, oxygen molecules are projected for 30 minutes at 500° C., so that its processing capability is very low.

SUMMARY OF THE INVENTION

An object of the present invention is to provide a method of fabricating a semiconductor device having a silicon oxide film with the stoichiometric composition ratio of silicon to oxygen of substantially 1:2 between a single-crystal silicon layer and a polysilicon layer.

In order to attain the above object, in accordance with one aspect of the present invention, there is provided a method of fabricating a semiconductor device comprising the steps of cleaning the single-crystal silicon surface within the opening formed in an insulating film on a first single-crystal silicon island region having a first conductivity type selectively formed in a single-crystal silicon substrate, supplying oxygen ions in the same vacuum chamber to form a silicon oxide film on the cleaned silicon surface, and depositing, in the same vacuum chamber, a poly or amorphous silicon doped with impurities or not doped.

In accordance with another aspect of the present invention, there is provided a method of fabricating a semiconductor device comprising the steps of forming a base region in a collector region, cleaning the surface of the base region, supplying oxygen ions to the cleaned surface of the base region at room temperature to form a silicon oxide film, and forming a polysilicon layer on the silicon oxide film.

In the method of fabricating a semiconductor device according to the present invention, ionized oxygen O$^-$ is projected to the surface of a silicon substrate with the aid of ECR (Electron Cyclotron Resonance) within an ultra-high-vacuum chamber to form a silicon oxide film which is as thin as 10 Å on the silicon substrate surface, and thereafter an amorphous or polysilicon film is successively deposited on the resultant surface within the same chamber.

The silicon oxide film formed in accordance with the present invention has the stoichiometric composition ratio of silicon to oxygen of 1:2 so that the current gain factor $h_{FE}$ of the semiconductor device can be greatly improved, and also the silicon oxide film is free from the influence from a natural oxide film so that its reproducibility can be enhanced.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Referring now to the drawings, embodiments of the present invention will be explained hereinafter.

It is to be noted that throughout the following explanation, similar reference symbols or numerals refer to the same or similar elements in all the figures of the drawings.

First, the Electron Cyclotron Resonance (hereinafter abbreviated as "ECR") technique used in the present invention will be explained.

Figure 9:
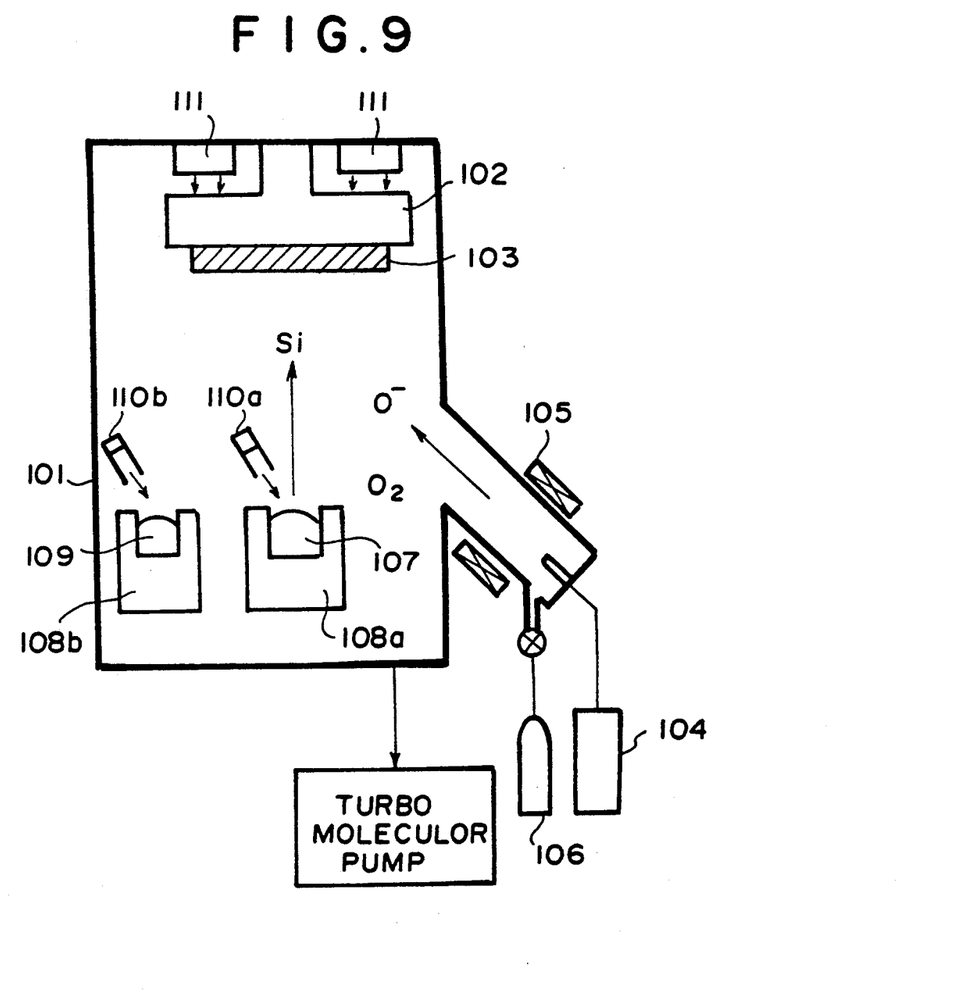
FIG. 9 is a schematic view of a fabrication device used in the embodiment of the present invention.

FIG. 9 schematically shows the ECR growth equipment which is actually used to carry out the present invention. A silicon substrate 103 supported on a holder jig 102 is placed within an ultrahigh-vacuum chamber 101. A heater 111 for controlling the temperature of the silicon substrate 103 is located near to the silicon substrate 103 in a state of non-contact therewith. The ultrahigh-vacuum chamber 101 with which a turbo molecular pump is connected is provided with an oxygen cylinder 106, a microwave generator 104 for ionization, and an electromagnet 105. Polysilicon 107 and antimony Sb 109 which are evaporated by electron guns 110a and 110b are accommodated in crucibles 108a and 108b, respectively. By using the ECR growth equipment constructed as described above, the semiconductor device according to the present invention can be fabricated.

FIGS. 1 to 7 are longitudinal sectional views showing the main steps in the process of fabricating an npn-type silicon bipolar transistor which is in accordance with one embodiment of the present invention and in which a self-alignment technique is not used between the base and the emitter of the transistor. However, it is needless to say that the present invention can be applied to other polysilicon emitter bipolar transistors. For example, the present invention can be applied to a double-layer polysilicon bipolar transistor with the base-emitter junction self-aligned, and also a hetero-junction bipolar transistor with the base region made of an SiGe alloy.

Figure 1:
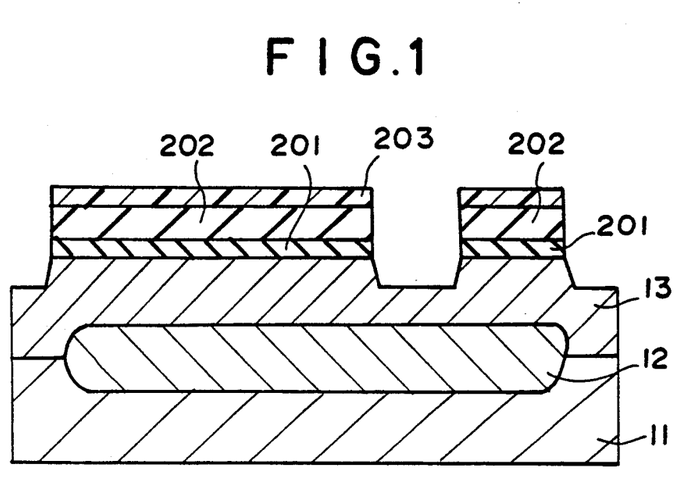
FIG. 1 is a sectional view of the semiconductor device after completion of one step in an embodiment of the present invention.

FIG. 1 is a longitudinal sectional view of the bipolar transistor with a groove formed in an area where an element isolation region is to be formed.

First, the surface of a p-type silicon substrate 11 having a resistivity of 10~20 Ωcm at room temperature is oxidized. A part of the silicon oxide film thus formed is removed or opened to have a window by photolithography process and etching process using hydrofluoric (HF) acid solution, and in this state arsenic is diffused into the silicon substrate using the remaining silicon oxide film as a diffusion mask to form a buried layer 12. After the silicon oxide film used as the mask is entirely etched away by using the HF acid, an n-type silicon epitaxial layer 13 with the phosphorous impurity concentration of about $1 \times 10^{16}$ atoms/cm$^3$ is grown about 1.3 μm in thickness. Then, during the epitaxial growth, a transient area is formed between the epitaxial layer 13 and the buried layer 12 so that the effective thickness of the epitaxial layer 13 having the substantially fixed phosphorous concentration is about 0.7 μm. Next, the surface of the n-type epitaxial layer 13 is oxidized to form a silicon oxide film 201 having a thickness of about 600 Å and further a silicon nitride film 202 is deposited thereon by low-pressure chemical vapor deposition (hereinafter referred as "LPCVD"). Thereafter, the photoresist 203 corresponding to an element isolation region and an emitter/collector isolation region is removed by photolithography process. Using the photoresist 203 as a mask, the silicon nitride film 202 and the silicon oxide film 201 are removed by dry etching process, and the n-type silicon epitaxial layer 13 is also etched by about 0.8 μm by dry etching process.

Figure 2:
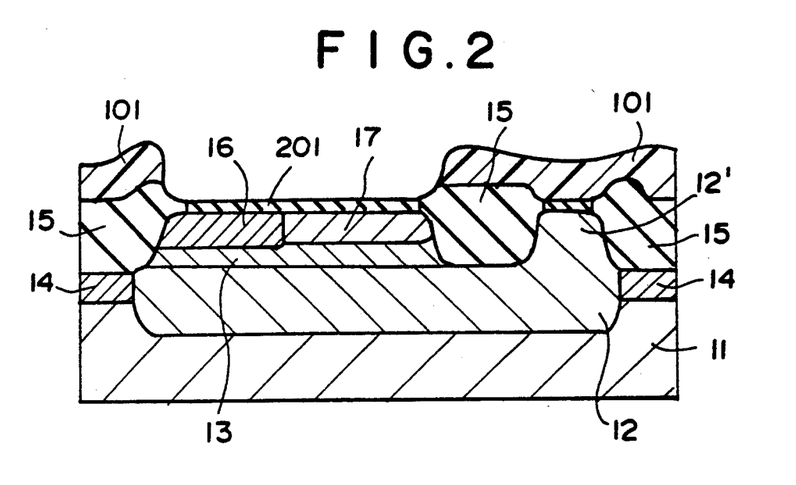
FIG. 2 is a sectional view of the semiconductor device after completion of the step subsequent to the one shown in FIG. 1.

As shown in FIG. 2, boron is ion-implanted at channel stopper areas under the condition of the dopings of $1 \times 10^{14}$ atoms/cm$^2$ and at 100 KeV. Further, in order to eliminate the crystal defect involved with the ion implantation, annealing is performed in an atmosphere of N$_2$ gas for 30 minutes at 900° C. to form an ion-implanted layer 14 for channel stopping (chanstop). Using as a mask the silicon nitride film 202 (see FIG. 1), selective oxidation is made to form the element isolation region 15 of the silicon oxide film. After having entirely etched away the silicon nitride film 202 used as the mask for the selective oxidation using heated phosphoric acid solution, a new silicon nitride film (not shown) is deposited again by LPCVD. Thereafter, the photoresist corresponding to a collector contact area is removed by the photolithography process. Using the photoresist as a mask, the silicon nitride film is removed to have a window by dry etching process. After having removed the photoresist, phosphorous is diffused using the silicon nitride film as a diffusion mask. The phosphorous diffused layer reaches the buried layer 12 to constitute a collector contact region 12' having a low resistance. After having oxidized the surface of the collector contact region 12' by about 1000 Å, the remaining silicon nitride film is removed using the heated phosphorous acid solution. Thereafter, the silicon oxide film 201 on the n-type silicon epitaxial layer 13 is etched away using the HF acid solution, and then, the n-type epitaxial layer 13 is oxidized to form a new silicon oxide layer 201 having a thickness of about 400 Å. The ion-implantation through this new silicon oxide film 201 for forming an intrinsic base layer provides less defects than that for the silicon epitaxial layer in a bare state.

The photoresist 101 corresponding to the approximate left half portion of the n-type epitaxial layer 13 is removed through the photolithography process, and using the remaining photoresist 101 as a mask, boron is ion-implanted with the dosage of $5 \times 10^{15}$ atoms/cm$^2$ and at 50 KeV to form a boron implanted region 16 for contact. It is needless to say that the photoresist is removed and heat treatment is performed to activate the boron implanted region 16. Next, the n-type epitaxial layer 13 is removed through the photolithography process again, and using the remaining photoresist 101, boron is ion-implanted with the dosage of $2 \times 10^{13}$ atoms/cm$^2$ and at 30 KeV to form the intrinsic base region 17 in the approximate right half portion of the n-type epitaxial layer 13. It is needless to say that the photoresist 101 is removed and heat treatment is performed to activate the boron implanted region 17. The state thus formed is shown in FIG. 2.

Figure 3:
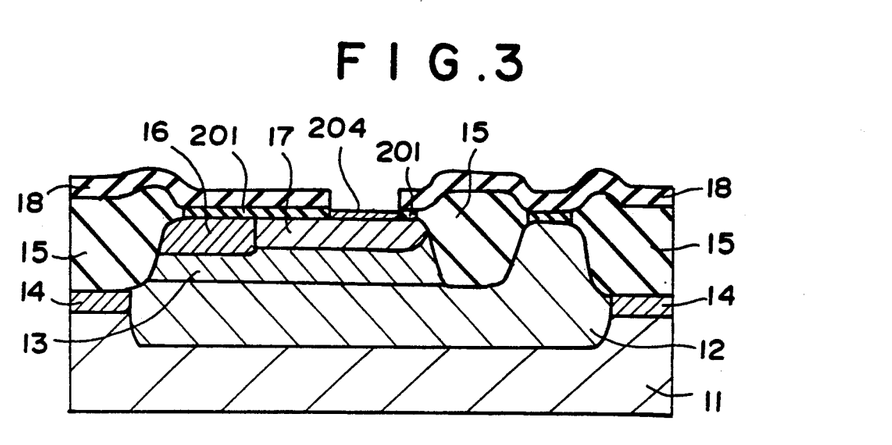
FIG. 3 is a sectional view of the semiconductor device after completion of the step subsequent to the one shown in FIG. 2.

FIG. 3 is a longitudinal section view of the semiconductor device after a window for an emitter has been opened. Specifically, the resultant surface in FIG. 2 is covered with a phosphorous glass film 18. Thereafter, the photoresist corresponding to the intrinsic base region 17 is removed through the photolithography process, and dry etching and chemical etching using the HF acid solution are performed to form an opening on the intrinsic base region 17. Further, pollution due to the heavy metal within the opening is eliminated by RCA-cleansing and, thereafter, in order to remove an oxide film 204 naturally formed on the intrinsic base region 17, the semiconductor wafer is immersed in the HF solution diluted with water to 1/50 for about 30 seconds. Nevertheless, the natural oxidized film 204 still remains as shown in FIG. 3, or such a natural oxidized film may be newly formed before the execution of the subsequent step.

Figure 4:
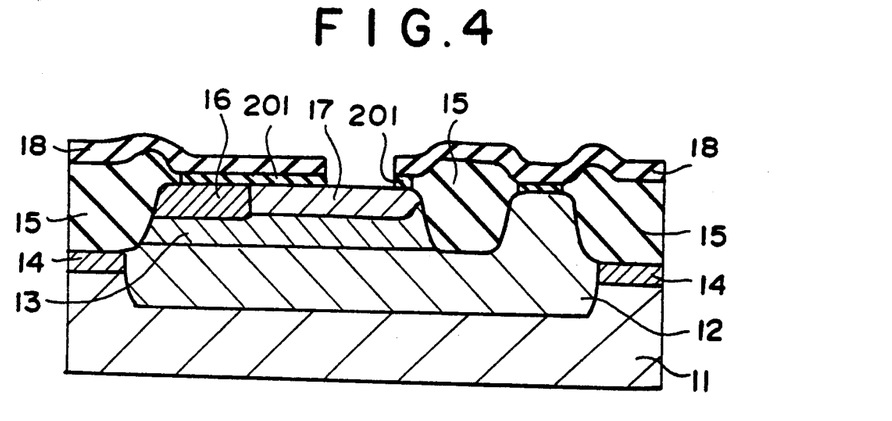
FIG. 4 is a sectional view of the semiconductor device after completion of the step subsequent to the one shown in FIG. 3.
Figure 5:
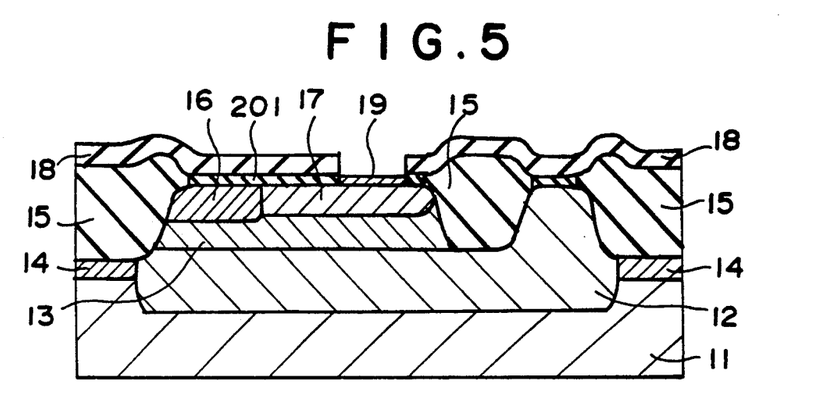
FIG. 5 is a sectional view of the semiconductor device after completion of the step subsequent to the one shown in FIG. 4.

In order to obviate such a problem, the wafer 103 shown in FIG. 3 is placed in the chamber shown in FIG. 9 to carry out the processing for eliminating the natural oxidized film 204. In this embodiment, for the purpose of shortening the time taken for elimination of natural oxidized film 204, first, electrons emitted from the electron gun 110a are applied to the polysilicon 107 accommodated in the crucible 108a at room temperature (RT) to evaporate on the natural oxidized film 204 the silicon, and deposit the silicon layer having substantially the same thickness (10 Å or so) as the natural oxidized film 204. Thereafter, the wafer is heat-treated for ten minutes under the vacuum degree of $5 \times 10^{-8}$ Torr and the temperature of about 850° C. Thus, the natural oxidized film 204 becomes SiO with a high vapor pressure and so will be removed or eliminated from the surface of the base region 17. Accordingly, the natural oxidized film 204, even if it is not sufficiently eliminated by the etching using the diluted HF acid solution or it is formed again, can be completely eliminated. Thus, the surface of the base region 17 is completely cleaned as shown in FIG. 4. The vacuum degree during the above process is set for $10^{-3}$ Torr or lower, preferably $10^{-5}$ Torr.

With the silicon wafer 103 placed in the chamber 101, at room temperature, oxygen is introduced from the oxygen cylinder 106 so as to set the partial pressure in the chamber 101 for $2 \times 10^{-5}$ Torr in a state where the microwave and magnetic field necessary to generate the electron cyclotron resonance have been applied, for example, the microwave at the frequency of 2.54 GHz and with the power of 100 W has been applied from the microwave generator 104 and the magnetic field having a magnetic strength of 1000 Gauss has been generated by the electromagnet 105. The oxygen introduced by the electron cyclotron resonance is ionized to generate oxygen ions $O^-$. Since the silicon wafer 103 has been biased by the voltage of 100 V or so, the oxygen ions $O^-$ are projected onto the silicon wafer 103. The oxygen ions $O^-$ are projected for several seconds to several tens seconds. In this embodiment, the oxidization was executed for 5 seconds. As a result, a silicon oxide (SiO$_2$) film 19 having a thickness in the order of 12 Å is formed on the cleaned surface of the base region 17.

Figure 10:
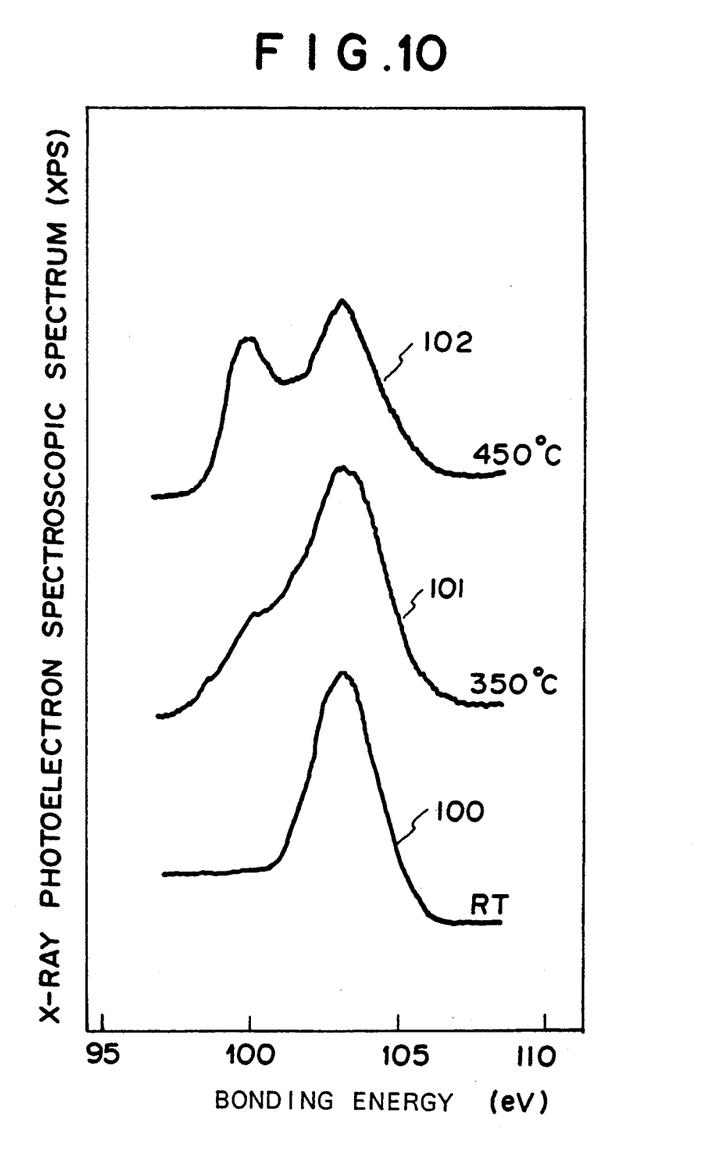
FIG. 10 is a graph showing oxidizing temperature dependency of the photoelectron spectroscopic spectrum (XPS) of the silicon oxide film formed in the embodiment of the present invention.

FIG. 10 shows the X-ray photoelectron spectrum (XPS) of silicon oxide films formed at several different substrate temperatures. The silicon oxide film 19 formed at the room temperature (RT) as described above, in which only the bonding energy peak of Si—O is observed as represented by the curve 100, has a stoichiometric composition ratio of silicon to oxygen of substantially 1 to 2. On the other hand, the silicon oxide films formed at the substrate temperatures of 350° C. and 450° C., respectively, in which not only the peak of Si—O but also the bonding energy peak of Si—Si is observed as represented respectively by the curves 101 and 102, result in silicon oxide films rich with silicon (Si). This seems to be for the reason that the ions reacting and combining with the base region 17 are reduced since the substrate temperature is relatively high even if the oxygen ions $O^-$ are projected. It should be noted that the silicon oxide film having a stoichiometric composition ratio of silicon to oxygen of substantially 1 to 2 can be formed at the substrate temperature of room temperature. In this case, since it is not necessary to apply temperature to the silicon substrate, the steps such as the controlling of the substrate temperature are not required. This contributes to an easy fabrication of the semiconductor device.

Again, referring back to FIG. 9, the introduced oxygen is not completely ionized, and a part thereof which remains oxygen molecules O$_2$ reaches the chamber 101. However, since the inside of the chamber 101 is in a high vacuum state and also the reacting energy of the oxygen molecules is much smaller than that of the oxygen ions $O^-$, the oxygen molecules O$_2$ are exhausted without reacting with the silicon wafer 103.

Figure 6:
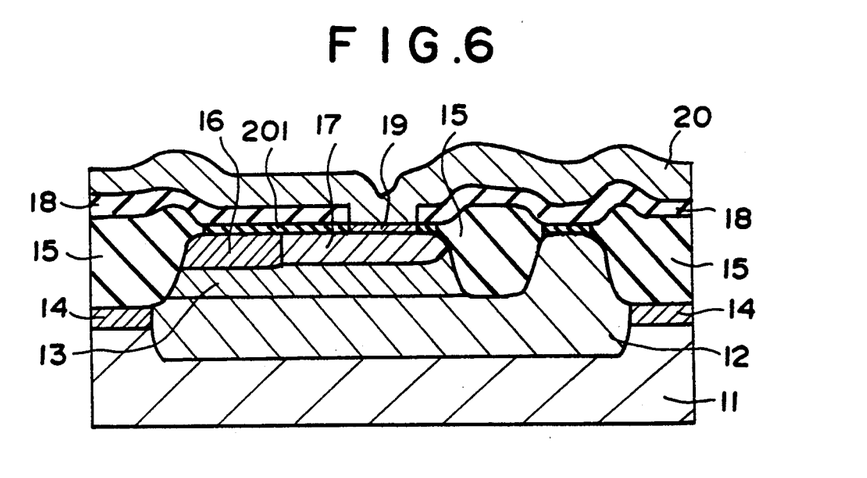
FIG. 6 is a sectional view of the semiconductor device after completion of the step subsequent to the one shown in FIG. 5.

After the silicon oxide film 19 has been formed, silicon 107 is evaporated from the crucible 108a by the electron gun 110a at the silicon substrate temperature of room temperature (RT) so that it deposits a silicon film having a thickness of about 2000 Å on the silicon wafer 103. The silicon film thus formed is amorphous. At the same time, antimony (Sb) is evaporated with the aid of the electron gun 110b to deposit an amorphous silicon doped with Sb of about $2 \times 10^{19}$ atoms/cm$^3$. The vacuum degree at this time was $5 \times 10^{-8}$ Torr. Thereafter, the silicon wafer 103 is heated to about 500° C. by the heater 111 so that the amorphous silicon is crystallized into a polycrystalline silicon (polysilicon). Thus, as shown in FIG. 6, the wafer 103 the entire surface of which is covered with an n-type polysilicon layer 20 can be obtained. This polysilicon layer 20, which can be also formed within the same chamber as the silicon oxide film 19 is formed, serves to prevent the film quality and thickness of the silicon oxide film from being varied. The silicon wafer 103 thus processed will be taken out from the vacuum chamber 101.

Figure 7:
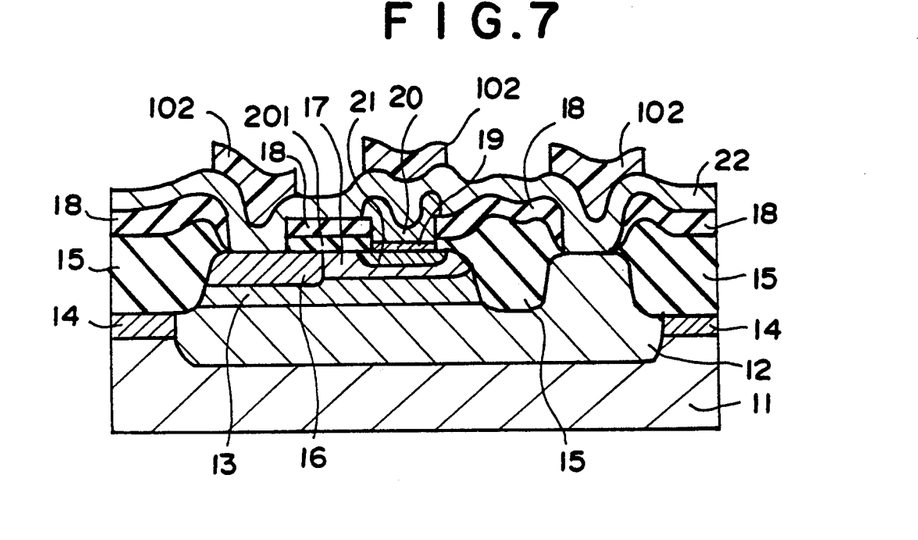
FIG. 7 is a sectional view of the semiconductor device after completion of the step subsequent to the one shown in FIG. 6.

Next, as shown in FIG. 7, using the photoresist left on the area which is slightly wider than the emitter opening area (i.e., wider than the sum of the fluctuation in alignment in the photolithography process and the amount of side-etching in the dry-etching of the polysilicon), the polysilicon layer 20 is removed by dry etching process. Thereafter, the impurities are diffused from the polysilicon layer 20 into the base region 17 by the heat treatment using a lamp annealer for 30 seconds at 900° C. to form a single-crystal emitter region 21. Contact holes for the electrodes for the base and the collector are made by the photolithography process and the dry etching process. An aluminum metal 22, for example, Al—Si (Al 99% and Si 1%) is sputtered on the entire surface of the wafer, and further, the photoresist pattern 102 for forming the emitter, base and collector electrodes are respectively formed thereon.

Figure 8:
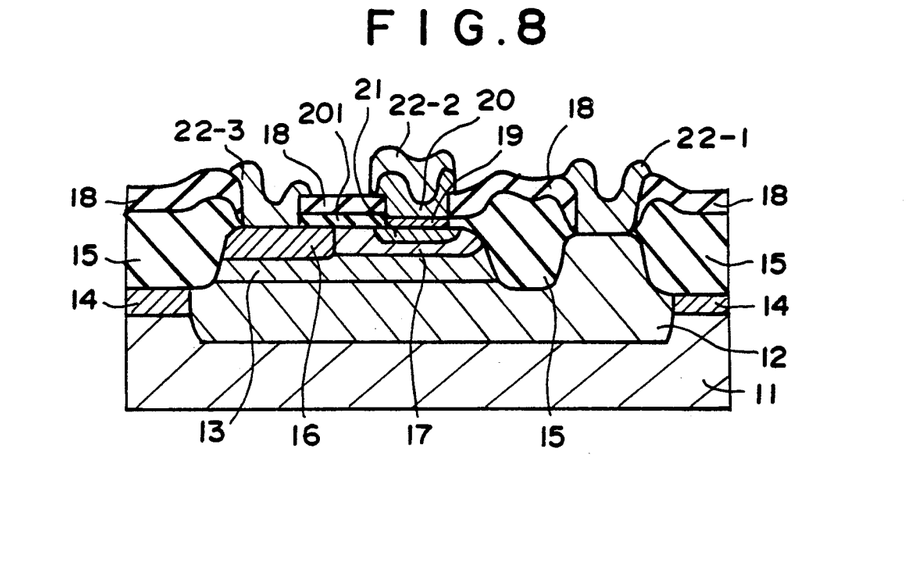
FIG. 8 is a sectional view of the semiconductor device after completion of the step subsequent to the one shown in FIG. 7.

Using the photoresist pattern 102 as a mask, unnecessary portions of the metal layer 22 are removed by dry etching process. After the photoresist pattern 102 has been eliminated, heat treatment for alloying is performed for 10 minutes at 400° C. to complete a bipolar transistor provided with a collector electrode 22-1, an emitter electrode 22-2 and a base electrode 22-3 as shown in FIG. 8.

Figure 11:
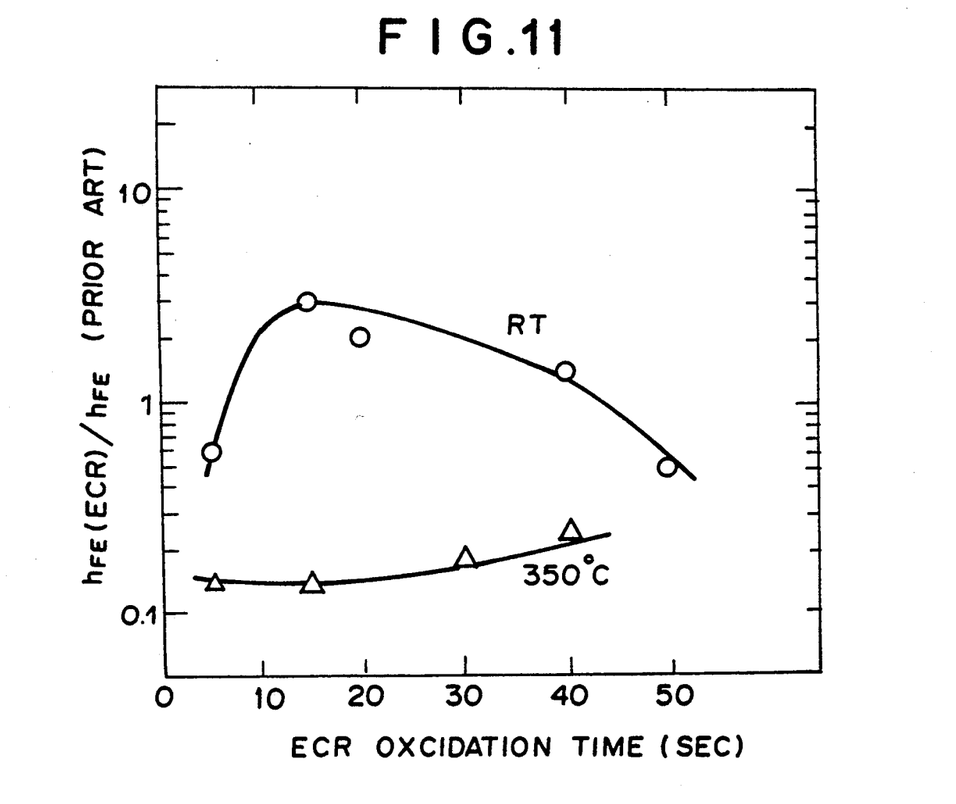
FIG. 11 is a graph showing oxidizing time dependency of the current gain factor $h_{FE}$ of a polysilicon emitter bipolar transistor fabricated in accordance with the present invention.

Shown in FIG. 11 is the ratio of the current gain factor $h_{FE}$ of the bipolar transistor fabricated according to the present invention to that in the prior art with the substrate temperature and the ECR oxidation time being taken as parameters. In the case of the substrate temperature of 350° C., the transistor according to the present invention has a lower current gain factor $h_{FE}$ than the prior art. However, in the case where the silicon oxide film 19 is formed by the ECR oxidation based on the projection of oxygen ions at room temperature (RT) as in the embodiment as described above, the resultant transistor has the current gain factor $h_{FE}$ improved three times as compared to that of the prior art transistor.

Accordingly, if the silicon oxide film is formed on the single-crystal by ECR in such a way that oxygen ions are supplied in an ultrahigh-vacuum state at the substrate temperature of room temperature, the silicon oxide film thus formed has a stoichiometric composition of silicon to oxygen of substantially 1 to 2, and also can have a uniform film thickness and film quality without fluctuations.

Although in the above embodiment, the polysilicon layer 20 for protecting the silicon oxide film 19 has been formed by the heat treatment for amorphous silicon, it may be formed by other methods. For example, silicon molecular beams may be projected to the silicon oxide film 19 and the phosphorous glass film 18 at 650° C. to directly deposit the polysilicon film 20. Further, the polysilicon film 20 is formed as it is and non-doped within the ultrahigh-vacuum chamber 101 at the amorphous silicon temperature of room temperature and, after this is polycrystallized, the wafer thus formed may be taken out from the chamber 101. Thereafter, under the condition of the implanting energy of 70 keV and the dosage of $1 \times 10^{16}$ atoms/cm$^2$, the polysilicon film having a thickness of, for example, 2000 Å as in the above embodiment may be ion-implanted with arsenic (As) so as to be made conductive. Then, the heat treatments are given at 800° C. for 30 minutes (furnace anneal to diffuse the arsenic in the polysilicon film) and 900° C. for 30 seconds (lamp anneal to diffuse it in the single-crystal) to form a single crystal emitter region. Further, the total amount of oxygen ions to be supplied depends on the product of the partial pressure of oxygen gas within the ultrahigh-vacuum chamber 101 and the ECR oxidation time, so that if the vacuum degree is made higher as compared with that in the above embodiment, the oxidation speed can be made slower thereby enabling to control the thickness of the silicon oxide film more precisely.

As explained hereinabove, in accordance with the present invention, the oxygen ionized by ECR growth equipment in an ultrahigh-vacuum chamber is projected to a silicon substrate at room temperature so that a silicon oxide film having a stoichiometric composition ratio of silicon to oxygen of substantially 1 to 2 can be formed. Thus, the resultant bipolar transistor can have a greatly improved current gain factor $h_{FE}$ as compared to the prior art bipolar transistors.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of fabricating a semiconductor bipolar transistor comprising:
   cleaning a single-crystal silicon surface within an opening formed in an insulating film on a first single-crystal silicon island region having a first conductivity type selectively formed in a single-crystal silicon substrate;
   forming a silicon oxide film on said cleaned silicon surface by applying only pure oxygen ions supplied into a vacuum chamber, said oxide film being formed at room temperature, said only pure oxygen ions being produced by electron cyclotron resonance ECR; and
   depositing, in said vacuum chamber, a poly or amorphous silicon layer doped with or without impurities.

2. A method of fabricating a semiconductor device comprising the steps of:
   forming a base region in a collector region;
   cleaning a surface of said base region;
   forming a silicon oxide film at room temperature by supplying only pure oxygen ions in a plasma produced by an electron cyclotron resonance ECR to the cleaned surface of said base region; and
   forming a polysilicon layer on said silicon oxide film.

3. A method of fabricating a bipolar transistor comprising:
   a first step of selectively forming a silicon oxide film on a monocrystalline silicon area by supplying only a pure oxygen ion gas produced by electron cyclotron resonance ECR at room temperature onto a single-crystalline silicon area in an atmosphere of the vacuum degree of $2 \times 10^{-5}$ Torr; and a second step of depositing a polycrystalline silicon film on said silicon oxide film whereby said monocrystalline silicon area constitutes an emitter region and said polycrystalline silicon film constitutes an emitter electrode.

4. A method of fabricating a bipolar transistor according to claim 3, wherein said ECR oxidation is performed for a period of time ranging from several seconds to several tens seconds at a substrate temperature of room temperature.

5. A method of fabricating a bipolar transistor according to claim 4, wherein said ECR oxidation is performed for 15 seconds.

6. A method of fabricating a bipolar transistor according to claim 3, further comprising the steps of, before the first step, exposing said monocrystalline silicon area and removing a natural oxidized film thus formed.

7. A method of fabricating a bipolar transistor according to claim 6, wherein said natural oxidized film is removed by heat treatment for 10 minutes at 850° C. in an atmosphere of the vacuum degree of $5 \times 10^{-8}$ Torr.

* * * * *